(12) United States Patent
Kim

(10) Patent No.: US 9,583,659 B2
(45) Date of Patent: Feb. 28, 2017

(54) SOLAR CELL MODULE

(71) Applicant: LG INNOTEK CO., LTD., Seoul (KR)

(72) Inventor: Kyung Am Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/359,231

(22) PCT Filed: Nov. 15, 2012

(86) PCT No.: PCT/KR2012/009663
§ 371 (c)(1),
(2) Date: May 19, 2014

(87) PCT Pub. No.: WO2013/073863
PCT Pub. Date: May 23, 2013

(65) Prior Publication Data
US 2014/0305488 A1     Oct. 16, 2014

(30) Foreign Application Priority Data

Nov. 18, 2011  (KR) ........................ 10-2011-0120825

(51) Int. Cl.
| | | |
|---|---|---|
| *H01L 31/00* | (2006.01) | |
| *H01L 31/042* | (2014.01) | |
| *H01L 31/048* | (2014.01) | |
| *H01L 31/02* | (2006.01) | |
| *H01L 31/05* | (2014.01) | |
| *H01R 12/53* | (2011.01) | |

(52) U.S. Cl.
CPC ..... *H01L 31/0485* (2013.01); *H01L 31/02008* (2013.01); *H01L 31/05* (2013.01); *H01R 12/53* (2013.01); *Y02E 10/50* (2013.01)

(58) Field of Classification Search
CPC . H01R 12/53; H01R 12/523; H01L 31/02013; H01L 31/02008
USPC .................................................. 136/244, 256
IPC .......... H01L 31/0485, 31/05, 31/02008; H01R 12/53; Y02E 10/50
See application file for complete search history.

(56) References Cited

U.S. PATENT DOCUMENTS

| | | | |
|---|---|---|---|
| 6,471,816 B1 * | 10/2002 | Shuto et al. .................. 156/256 |
| 2002/0062858 A1 * | 5/2002 | Mowles ............ H01L 31/02167 136/252 |

(Continued)

FOREIGN PATENT DOCUMENTS

| | | | |
|---|---|---|---|
| JP | H06-120533 | | 4/1994 |
| JP | 08172210 A | * | 7/1996 |

(Continued)

OTHER PUBLICATIONS

English machine translation of JPH 08-172210 A, accessed 2015.*

(Continued)

*Primary Examiner* — Luan Van
*Assistant Examiner* — Angelo Trivisonno
(74) *Attorney, Agent, or Firm* — Saliwanchik, Llloyd & Eisenschenk

(57) ABSTRACT

Disclosed is a solar cell module. The solar cell module includes a substrate including at least one hole, and a first surface and a second surface opposite to each other; a solar cell panel located on the first surface and including a plurality of solar cells; a bus bar connected to one of the solar cells; and a cable for outputting a current of the solar cell panel to an outside, wherein the bus bar makes contact with the cable through the hole.

15 Claims, 3 Drawing Sheets

(56) References Cited

U.S. PATENT DOCUMENTS

| | | | |
|---|---|---|---|
| 2005/0000561 A1* | 1/2005 | Baret | H01L 31/048 136/244 |
| 2005/0072456 A1* | 4/2005 | Stevenson et al. | 136/244 |
| 2008/0156365 A1* | 7/2008 | Scholz et al. | 136/251 |
| 2009/0126785 A1 | 5/2009 | Yagiura | |
| 2011/0165441 A1* | 7/2011 | Genies | H02S 40/38 429/9 |

FOREIGN PATENT DOCUMENTS

| | | |
|---|---|---|
| JP | H08-172210 | 7/1996 |
| JP | 2002-252362 A | 9/2002 |
| JP | 2009-129926 A | 6/2009 |

OTHER PUBLICATIONS

English machine translations of JPH 08-172210 A (2015).*
International Search Report in International Application No. PCT/KR2012/009663, filed Nov. 15, 2012.

* cited by examiner

SOLAR CELL MODULE

CROSS-REFERENCE TO RELATED APPLICATIONS

This application is the U.S. national stage application of International Patent Application No. PCT/KR2012/009663, filed Nov. 15, 2012, which claims priority to Korean Application No. 10-2011-0120825, filed Nov. 18, 2011, the disclosures of each of which are incorporated herein by reference in their entirety.

TECHNICAL FIELD

The embodiment relates to a solar cell module.

BACKGROUND ART

A solar cell module to convert light energy into electrical energy through photoelectric conversion effect has been extensively known as a device to obtain non-pollution energy contributing to the conservation of global environment.

As the photoelectric conversion effect is improved, a great number of solar cell systems having a solar cell module are installed even for home use.

In order to output power generated from the solar cell module including solar cells that generate power from the light of the sun, conductors acting as positive and negative electrodes are provided in the solar cell module, and terminals of the conductors, which serve as connectors connected to a cable for outputting current to the outside, are provided outside a photovoltaic module.

In BIPV (Building Integrated Photovoltaic System) substituted for a transparent glass of a building, a junction box, which serves as an electrical connection path of the photoelectric conversion power generated from the solar cell to another electric generation system, protrudes to an outside, so that construction and treatment are difficult, and since the junction box is directly exposed to an outside, the junction box may be damaged.

In addition, the junction box protruding to the outside causes the external appearance thereof to be deteriorated and interrupts slimness of the solar cell module.

DISCLOSURE OF INVENTION

Technical Problem

The embodiment provides a solar cell module having a slim structure and representing improved reliability.

Solution to Problem

According to the embodiment, there is provided a solar cell module. The solar cell module includes a substrate including at least one hole, and a first surface and a second surface opposite to each other; a solar cell panel located on the first surface and including a plurality of solar cells; a bus bar connected to one of the solar cells; and a cable for outputting a current of the solar cell panel to an outside, wherein the bus bar makes contact with the cable through the hole.

Advantageous Effects of Invention

According to the solar cell module of the embodiment, a junction box used in the related art to connect a bus bar and a cable can be omitted. Thus, a terminal box is not exposed to an outside. Therefore, the solar cell module according to the embodiment may have improved external appearance and a slim and simple structure. In addition, the solar cell module according to the embodiment can be free in terms of construction and treatment.

MODE FOR THE INVENTION

Figure 1:
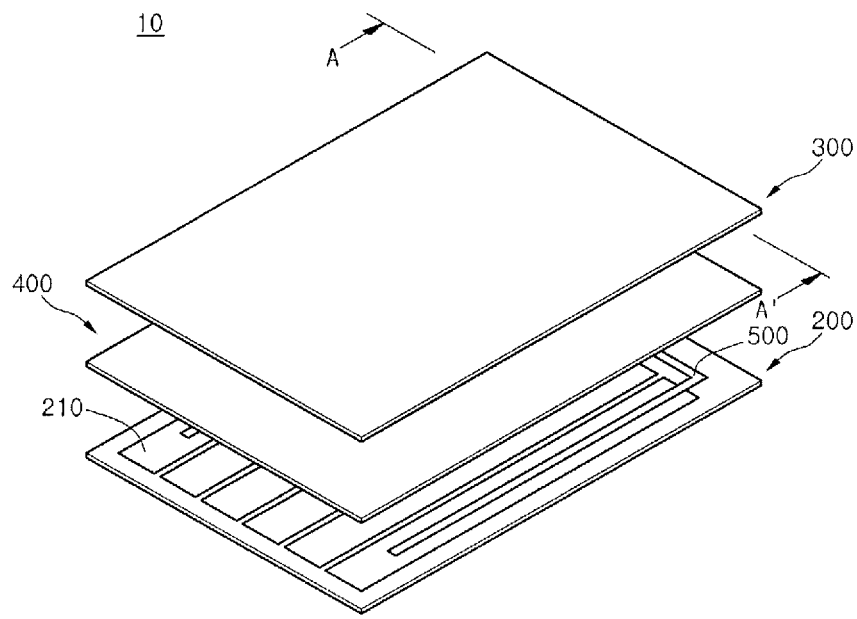
FIG. 1 is an exploded perspective view showing a solar cell module according to the first embodiment.
Figure 2:
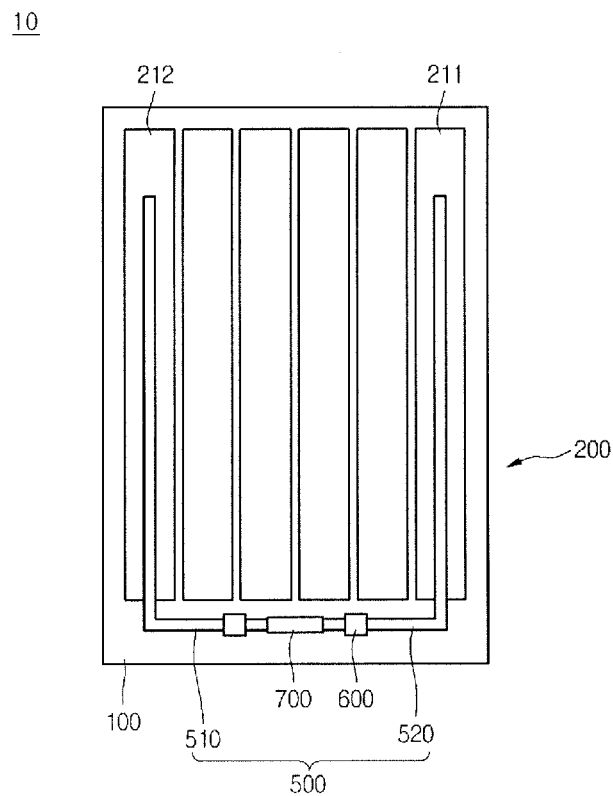
FIG. 2 is a plan view showing the solar cell panel according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of the layer (or film), the region, the pattern, or the structure does not utterly reflect an actual size.

Hereinafter, the embodiment will be described with reference to accompanying drawings in detail.

Figure 3:
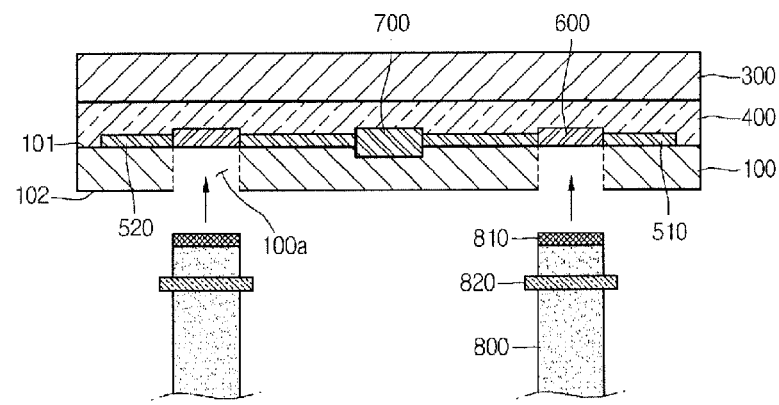
FIG. 3 is a sectional view taken along line A-A' of FIG. 1.
Figure 4:
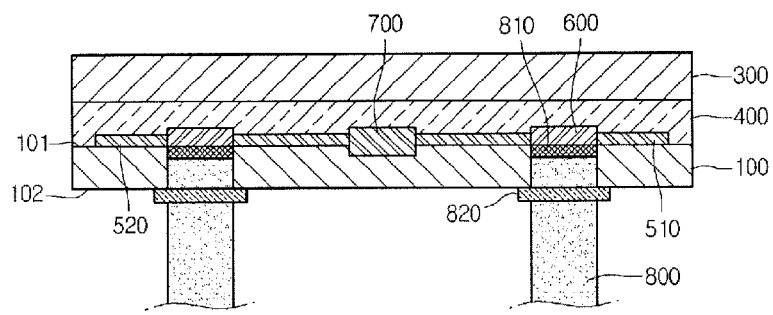
FIG. 4 is a sectional view showing a connected state of the cable in FIG. 3.

A solar cell module will be described in detail with reference to FIGS. 1 to 4. FIG. 3 is a sectional view taken along line A-A' of FIG. 1. FIG. 4 is a sectional view showing a connected state of the cable in FIG. 3. FIG. 4 is a sectional view showing a connected state of the cable in FIG. 3.

Referring to FIGS. 1 to 4, the solar cell module 10 includes a lower substrate 100, a solar cell panel 200, an upper substrate 300, a buffer sheet 400, a bus bar 500, a terminal part 600, a connector 700, and a cable 800.

The lower substrate 100 is located at the lowermost part of the solar cell module 10. The lower substrate 100 may support the solar cell panel 200.

The lower substrate 100 is transparent and has higher strength. The lower substrate 100 may include tempered glass.

Referring to FIG. 3, the lower substrate 100 includes a first surface 101 and a second surface 102 which are faced with each other.

The lower substrate 100 includes at least one hole 100a. The lower substrate 100 may include two holes 100a.

The bus bar 500 and the cable 899 may be connected to each other through the hole 100a, which will be described below.

The solar cell panel 200 is located on the lower substrate 100. The solar cell panel 200 is located on the first surface 101.

The solar cell panel 200 has a plate shape and includes a plurality of solar cells 210.

The solar cells 210 may include a CIGS-based solar cell, a silicon-based solar cell, a dye-sensitized solar cell, a group II-VI compound semiconductor solar cell, or a group III-V compound semiconductor solar cell.

In addition, the solar cells 210 may be provided on a transparent substrate such as a glass substrate.

The solar cells 210 may be arranged in the shape of a stripe. In addition, the solar cells may be arranged in various shapes such as a matrix shape.

The protection substrate 300 is provided on the solar cell panel 200. In more detail, the protection substrate 300 is provided in opposition to the solar cell panel 200.

The protection substrate 300 is transparent and has higher strength. The protection substrate 300 may include tempered glass.

The buffer sheet 400 is interposed between the protection substrate 300 and the solar cell panel 200. The buffer sheet 400 protects the solar cell panel 200 from the external physical shock. In addition, the buffer sheet 400 prevents the protection substrate 300 from colliding with the solar cell panel 200.

The buffer sheet 400 may perform an anti-reflective function so that a greater amount of light is incident onto the solar cell panel 200.

The buffer sheet 400 may include ethylenevinylacetate resin (EVA resin).

The bus bar 500 is provided on the solar cell panel 200. The bus bar 500 makes contact with two tope surfaces of the solar cell panel 200 and is electrically connected to the solar cells 210.

For example, the connection part 510 includes a first bus bar 510 and a second bus bar 520.

The first bus bar 510 makes contact with the top surface of one outermost solar cell 212 of the solar cells 210, and the second bus bar 520 makes contact with the top surface of the other outmost solar cell 211 of the solar cells 210.

The bus bar 500 may include a conductor, and may include copper (Cu).

The bus bar 500 may be connected to the cable 800 through the hole 100a.

The terminal part 600 may be placed on the first surface 101. The terminal part 600 may be placed on an upper portion of the hole 100a. That is, the terminal part 600 may be placed on the first surface 101 while covering the hole 100a.

The terminal part 600 may be placed at an end of the bus bar 500. The terminal part 600 may be connected to the bus bar 500 and the cable 800.

The cable 800 is electrically connected to the solar cell panel 200 through the bus bar 500. In other words, electrical energy generated from the solar cell panel 200 is transferred to a rectifier and/or a battery through the cable 800.

In addition, the cable 800 may be connected to an adjacent solar cell module. That is, a plurality of solar cell modules may be connected to each other through the cable 800.

The cable 800 may be connected to the bus bar 500 on the second surface 102 through the hole 100a.

At least one portion of the cable 800 may be inserted into the hole 100a.

The cable 800 may include an electrode 810 at an end of the cable 800. The electrode 810 may make contact with the terminal part 600. Thus, the cable 800 may be connected to the bus bar 500.

The cable 800 may be screw-coupled to the hole 100a. That is, a female screw may be formed at an inside wall of the hole 100a and a male screw may be formed at an outside of the cable 800. However, the embodiment is not limited thereto and the cable 800 may be combined with the hole 100a by using an adhesive. The cable 800 and the hole 100a are combined with each other through various schemes.

The cable 800 may include a protection part 820. Referring to FIG. 4, when the cable 800 is inserted into the hole 100a, the protection part 820 may be placed on the second surface 102. That is, when the cable 800 is inserted into the hole 100a, the protection part 820 may surround the hole 100a exposed toward the second surface 102.

The connector 700 may be placed on the first surface 101 of the lower surface 100. The connector 700 may include a conductor and an insulator, and may be a bypass diode.

The existing junction box for connecting the bus bar 500 and the cable 800 with each other may be omitted due to the solar cell module 10 according to the first embodiment. Thus, the solar cell module 10 according to the embodiment may have an improved external appearance and a slim and simple structure. In addition, the solar cell module 10 according to the embodiment may be free in terms of construction and treatment.

Hereinafter, a solar cell module according to the second embodiment will be described with reference to FIGS. 5 and 6. The details of the parts the same as or similar to the above-described parts will be omitted for the clear and brief description.

Figure 5:
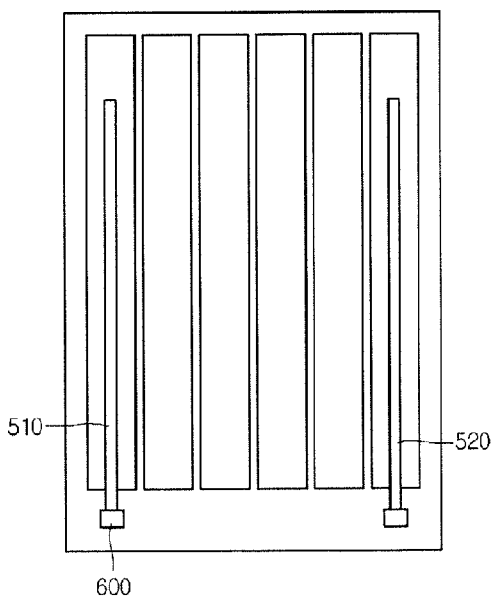
FIG. 5 is a sectional view showing a solar cell module according to the second embodiment.

FIG. 5 is a sectional view showing the solar cell module according to the second embodiment. FIG. 6 is a sectional view showing a state of connecting solar cell modules with each other according to the second embodiment.

Figure 6:
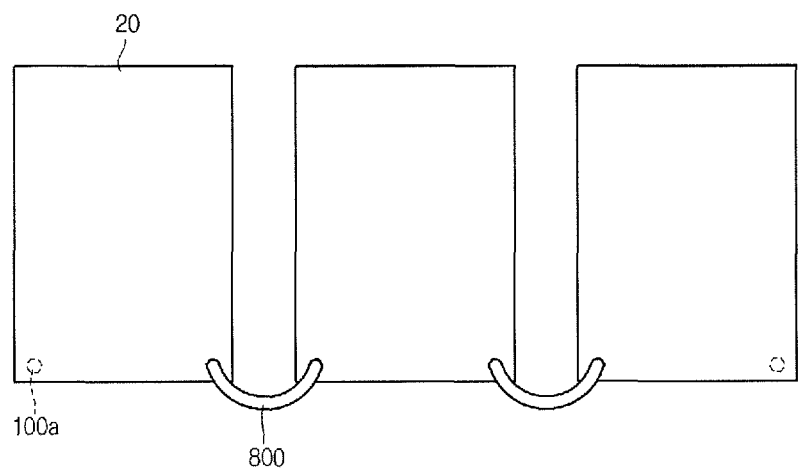
FIG. 6 is a sectional view showing a state of connecting solar cell modules with each other according to the second embodiment.

Referring to FIGS. 5 and 6, an end of the bus bar 500 included in the solar cell module 20 according to the second embodiment may be placed only at a periphery of the lower substrate 100. That is, the terminal part 600 placed at the end of the bus bar 500 may be placed at an edge portion of the lower substrate 100. Thus, the hole 100a included in the lower substrate 100 may be placed at the edge portion of the lower substrate 100. Thus, a length of the cable 800 connected into the hole 100a may be minimized. That is, referring to FIG. 6, the solar cell modules 20 may be connected to each other through the hole 100a of the edge portion while minimizing the length of the cable 800.

Hereinafter, referring to FIG. 7, a solar cell module according to the third embodiment will be described.

Figure 7:
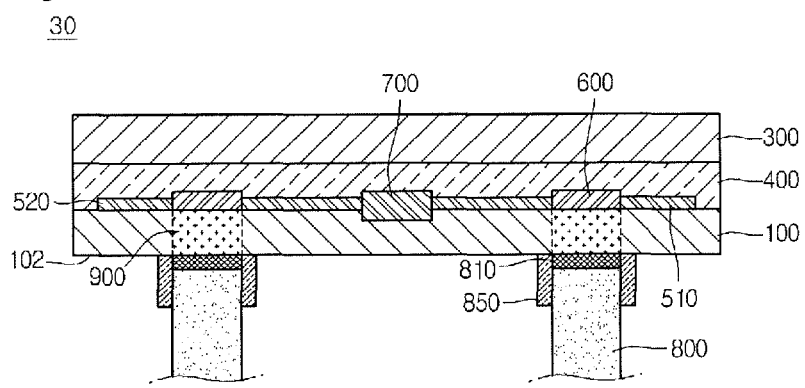
FIG. 7 is a sectional view showing a solar cell module according to the third embodiment.

FIG. 7 is a sectional view showing the solar cell module according to the third embodiment.

Referring to FIG. 7, the solar cell module 30 according to the third embodiment further includes a connecting part 900 and a receiving part 850.

The connecting part 900 may be placed in the hole 100a. The connecting part 900 may include a solder. That is, the connecting part 900 may include an alloy and may be formed through soldering.

The cable 800 may be placed on the connecting part 900. In detail, the cable 800 may be connected to the connecting part 900 on the second surface 102 of the lower substrate 100.

The connecting part 900 may make contact with the terminal part 600 and the electrode 810. That is, the connecting part 900 may make contact with the terminal part 600 and the electrode 810 at two different surfaces.

The receiving part 850 may be placed on the second surface 102. The receiving part 850 may be placed while surrounding the hole 100a. The receiving part 850 may be placed at a portion to which the cable 800 is connected. The receiving part 850 may receive the cable 800. The cable 800 may be stably connected to the connecting part 900 through the receiving part 850.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
   a substrate including a plurality of holes, a first surface, and a second surface opposite to the first surface, wherein the plurality of holes is exposed towards the second surface;
   a solar cell panel located on the first surface and including a plurality of solar cells;
   a bus bar connected to a solar cell of the plurality of solar cells;
   a connector disposed on the first surface of the substrate;
   a terminal part disposed on the first surface of the substrate; and
   a cable for outputting a current of the solar cell panel to an outside,
   wherein the cable includes a protection part disposed on the second surface of the substrate when the cable is inserted into a first hole of the plurality of holes;
   wherein an outer lateral surface of the protection part is in direct, physical contact with the second surface of the substrate when the cable is inserted into the first hole;
   wherein the protection part surrounds the first hole when the cable is inserted into the first hole;
   wherein a width of the protection part is larger than a width of the first hole;
   wherein the terminal part is disposed on an upper portion of the first hole;
   wherein the terminal part is disposed at an end of the bus bar;
   wherein the terminal part is disposed on a same plane as the bus bar,
   wherein the cable is provided at an end thereof with an electrode that makes contact with the terminal part,
   wherein one surface of the terminal part makes contact with one entire surface of the electrode,
   wherein a width of the first hole corresponds to a width of the electrode,
   wherein a width of the terminal part corresponds to the width of the electrode,
   wherein the terminal part has a plate shape, and
   wherein the electrode has a plate shape.

2. The solar cell module of claim 1, wherein the first hole is placed at a portion corresponding to the end of the bus bar.

3. The solar cell module of claim 1, wherein the cable is connected to the bus bar on the second surface of the substrate through the first hole.

4. The solar cell module of claim 1, wherein the first hole is screw-coupled with the cable.

5. A solar cell module comprising:
   a substrate including a plurality of holes, a first surface, and a second surface opposite to the first surface;
   a solar cell panel located on the first surface and including a plurality of solar cells;
   a bus bar connected to a solar cell of the plurality of solar cells;
   a connector disposed on the first surface of the substrate;
   a terminal part disposed on the first surface of the substrate;
   a cable for outputting a current of the solar cell panel to an outside; and
   a receiving part disposed on the second surface of the substrate;
   wherein the cable is disposed on a connecting part which is disposed at an inside of a first hole of the plurality of holes;
   wherein the receiving part receives the cable;
   wherein the receiving part is in direct, physical contact with an outer lateral surface of the cable;
   wherein the cable is provided at an end thereof with an electrode and the connecting part makes contact with the terminal part and the electrode on two mutually different surfaces thereof;
   wherein one surface of the terminal part makes contact with one entire surface of the electrode;
   wherein the terminal part is disposed on an upper portion of the first hole;
   wherein the terminal part is disposed at an end of the bus bar;
   wherein the terminal part is disposed on a same plane as the bus bar,
   wherein a width of the first hole corresponds to a width of the electrode,
   wherein a width of the terminal part corresponds to the width of the electrode,
   wherein the terminal part has a plate shape, and
   wherein the electrode has a plate shape.

6. The solar cell module of claim 5, wherein the connecting part includes a solder.

7. The solar cell module of claim 5, wherein the receiving part is disposed surrounding the first hole.

8. The solar cell module of claim 5, wherein the receiving part is disposed at a portion to which the cable is connected.

9. The solar cell module of claim 5, wherein the cable is connected to the connecting part through the receiving part.

10. The solar cell module of claim 1, wherein a lateral width of the protection part is greater than a lateral width of the cable.

11. The solar cell module of claim 6, wherein the connecting part comprises an alloy and is formed through soldering.

12. The solar cell module of claim 1, wherein the bus bar comprises a first bus bar and a second bus bar, and
wherein the first bus bar makes contact with a top surface of one outermost solar cell of the solar cells, and the second bus bar makes contact with a top surface of the other outmost solar cell of the solar cells.

13. The solar cell module of claim 12, wherein the connector is disposed between the first bus bar and the second bus bar.

14. The solar cell module of claim 5, wherein the bus bar comprises a first bus bar and a second bus bar, and
wherein the first bus bar makes contact with a top surface of one outermost solar cell of the solar cells, and the second bus bar makes contact with a top surface of the other outmost solar cell of the solar cells.

15. The solar cell module of claim 14, wherein the connector is disposed between the first bus bar and the second bus bar.

* * * * *